United States Patent [19]

Stinson et al.

[11] Patent Number: 4,623,841

[45] Date of Patent: Nov. 18, 1986

[54] METHOD AND APPARATUS FOR MEASURING MAGNETIC PROPERTIES OF MAGNETIC MATERIALS USING POSITIVE AND NEGATIVE MAGNETIC SATURATION OF THE MATERIALS

[75] Inventors: Michael K. Stinson, Scottsdale; William L. Hines, Chandler; David J. Hesser, Tempe, all of Ariz.

[73] Assignee: Motorola, Inc., Schaumburg, Ill.

[21] Appl. No.: 718,040

[22] Filed: Mar. 29, 1985

[51] Int. Cl.[4] .................. G01R 33/14; G01N 27/72
[52] U.S. Cl. ............................ 324/223; 324/211; 324/239
[58] Field of Search ............ 324/222, 223, 232, 233, 324/239, 211

[56] References Cited

U.S. PATENT DOCUMENTS 3,214,609 10/1965 Drew et al.
4,207,520 6/1980 Flora et al. .................. 324/233
4,296,376 10/1981 Bartol.
4,314,200 2/1982 Marek.

FOREIGN PATENT DOCUMENTS 676958 7/1979 U.S.S.R. .................. 324/223
875320 10/1981 U.S.S.R. .................. 324/223

OTHER PUBLICATIONS

IEEE Standards on Electronic Computers: *Methods of Testing Bobbin Cores*, 1962, pp. 20-24.
DeMott, Elmer G., *Integrating Fluxmeter with Digital Readout*, IEEE Transactions on Magnetics, vol. MAG-6, No. 2, Jun. 1970, pp. 269-271.
Capptuller, Horst, *Numeric and Graphic Recording of Magnetization Curves by Means of Analog-Digital Techniques*, IEEE Trans. on Magnetics, vol. MAG-6, No. 2, Jun. 1970, pp. 263-265.
Plassard, J., *Hysteresisgraph with Discontinuous Sweep Mode*, Journal of Magnetism and Magnetic Materials 19 No. 1-3, Apr. 11, 1980, pp. 260-262.

*Primary Examiner*—Gerard R. Strecker
*Attorney, Agent, or Firm*—Raymond J. Warren

[57] ABSTRACT

A piece of the magnetic material to be tested is coupled to the device by primary and secondary windings. The material is then exposed to varying polarities of a controlled electrical current, such as a ramped current, through the primary winding causing the magnetic flux of the material to vary with respect to the controlled current; and creating varying voltage levels across the secondary winding. When this process has been completed the data is made available to a computer which now has data for the current levels transmitted through the primary winding and the corresponding voltage levels across the secondary winding. The computer can then utilize this data to provide a variety of magnetic property values of the magnetic material.

9 Claims, 3 Drawing Figures

METHOD AND APPARATUS FOR MEASURING MAGNETIC PROPERTIES OF MAGNETIC MATERIALS USING POSITIVE AND NEGATIVE MAGNETIC SATURATION OF THE MATERIALS

BACKGROUND OF THE INVENTION

This invention relates, in general, to testing apparatus and methods and, more particularly, to an apparatus and method for testing magnetic materials.

Traditionally, flux measurements have been conducted with a ballistic galvanometer that deflects a light beam. This is a slow, cumbersome, and inaccurate method.

Another method is using Hall Effect sensors along with a permanent magnet. In this process a sample is moved at a constant speed through the magnetic field while measurements are taken with the Hall Effect device. This method is slow and inaccurate and the results of this method can be influenced by temperature.

An improvement of the Hall Effect device uses solid state devices, see DeMott, Integrating Flux Meter With Digital Read Out, 6 I.E.E.E. Trans. On Mag., 269 (1970). This device is derived by coupling a solid-state voltage-to-frequency converter to a digital converter. This device, however, is unable to make the variety of measurements often desired and has a narrow range of operating conditions.

Further, the I.E.E.E. standard has no storage for the text results and has little or no control over the rate of rise of the current pulses used.

SUMMARY OF THE INVENTION

Accordingly, it is an object of the present invention to provide an apparatus and method of testing magnetic materials that will overcome the deficiencies described above.

A further object of the present invention is to provide an apparatus and method of testing magnetic materials that provided an increased frequency response.

Another object of the present invention is to provide an apparatus and method of testing magnetic materials that is versatile in its ability to test a variety of magnetic properties.

Still another object of the present invention is to provide an apparatus and method of testing magnetic materials that has a high dynamic range.

Yet another object of the present invention is to provide an apparatus and method of testing magnetic materials that has increased speed and accuracy.

A further object of the present invention is to provide an apparatus and method of testing magnetic material that has accurate control over the rate of rise and fall of the current pulses used.

The above and other objects and advantages of the present invention are provided by an apparatus and method of testing magnetic materials that is computer operated.

A particular embodiment of the method of the present invention consists of the steps of: providing a current pulse of a first polarity to a primary winding coupled to said magnetic material; changing the magnetization of said magnetic material and driving a flux density of said magnetic material to a saturation level of said first polarity and then down to a residual level of said first polarity; providing a controlled current pulse of a second polarity to said primary winding; changing the magnetization of said magnetic material and driving said flux density from said residual level of said first polarity to a saturation level of said second polarity and then to a residual level of said second polarity; measuring changes in a voltage across a secondary winding coupled to said magnetic material during said current pulse of said second polarity; converting said measured voltages to digital signals; storing said digital signals in a storage device; providing a second controlled current pulse of said second polarity to said primary winding; changing the magnetization of the magnetic material driving said flux density from said residual level of said second polarity to said saturation level of said second polarity and back to said residual level of said second polarity; measuring changes in the voltage across said secondary winding during said second current pulse of said second polarity; converting said measured voltages to digital signals; storing said digital signal in said storage device; and processing the data in said storage device.

DETAILED DESCRIPTION OF THE INVENTION

Figure 1:
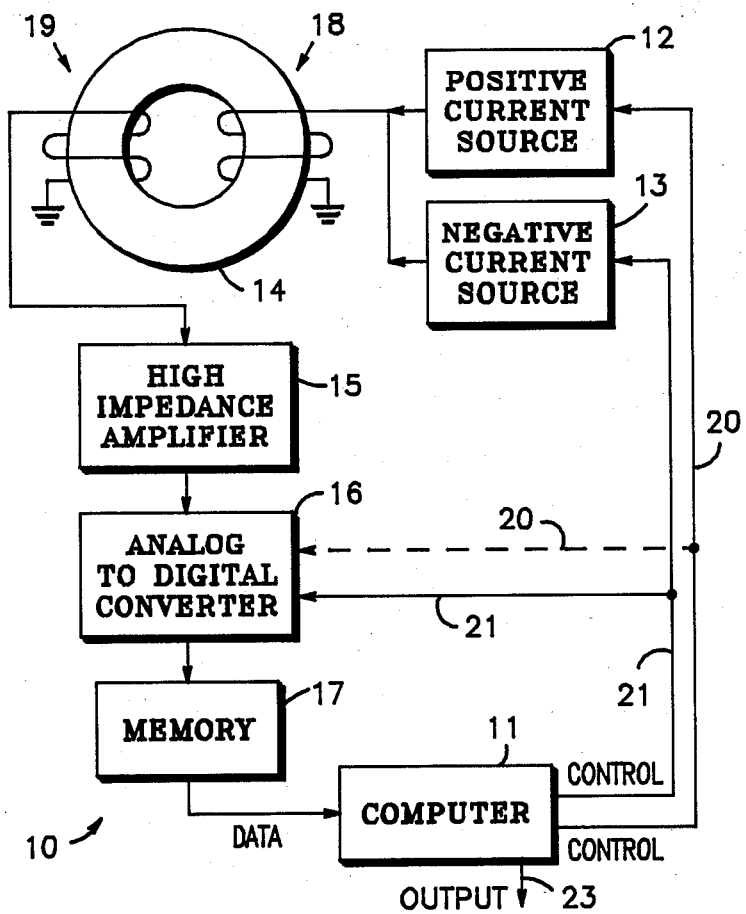
FIG. 1 is a block diagram of a device embodying the present invention.

Referring to the block diagram of FIG. 1 a device 10, embodying the present invention, for testing magnetic materials is illustrated. Device 10 consists of a computer 11, such as the 9616 produced by Creative Microsystems; positive, 12, and negative, 13, current sources; a high impedance amplifier 15, such as the HA2520 produced by Harris, Inc.; an analog-to-digital (A/D) converter 16, such as the TDC1007J produced by TRW, Inc.; and a memory 17, such as the MCM93425DC produced by Motorola, Inc.

A piece of magnetic material 14, here a toroid, is coupled to device 10 by a primary test winding 18 and secondary test winding 19. It should be noted here that, for other shapes of magnetic materials, other forms of connection can be devised.

In operation, computer 11 activates positive and negative current sources, 12 and 13, along lines 20 and 21, respectively, to provide a current to primary winding 18. The current provided by current sources 12 and 13 is of a controlled known rate of change. This causes changes in the magnetization of toroid 14 which induces a voltage in secondary winding 19. The analog signal from secondary winding 19 is converted to digital signals by A/D converter 16 which are then stored in memory 17 for later use by computer 11.

A more detailed description of the operation has computer 11 activate positive current source 12 to provide a positive current to primary winding 18. This is illustrated as pulse $P_1$, FIG. 2. Pulse $P_1$ is provided to drive the magnetic field, H, and magnetic flux, B, of a hysteresis loop, FIG. 3 to a point $B_{max}$.

Figure 3:
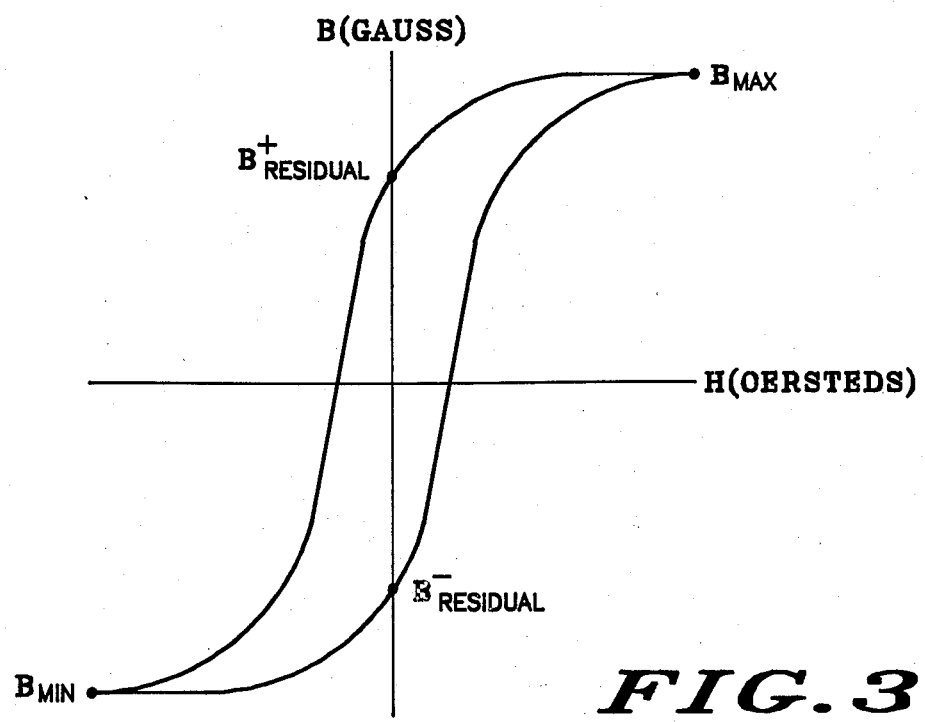
FIG. 3 is a graph of a hysteresis loop generated by the device of FIG. 1.

The hysteresis loop of FIG. 3 is a curve showing two values of magnetic flux density, one when the magnetizing force is increasing and the other when it is decreasing. In this graph H represents the magnetic field measured in oersteds and B represents the magnetic flux measured in gauss. The points $B_{max}$ and $B_{min}$ represent the points of positive and negative saturation, respectfully, on the hysteresis loop.

Once pulse $P_1$ has driven the magnetic flux to $B_{max}$, computer 11 reduces positive current source 12. This allows the magnetic flux of toroid 14 to fall back to point $+B_{residual}$, FIG. 3. Since the natural state of the magnetic flux of torroid 14 can be either $+B_{residual}$ or $-B_{residual}$, pulse $P_1$ is used to insure that magnetic flux density will be at $+B_{residual}$ thereby providing a known starting point for the measurements to be made.

Figure 2:
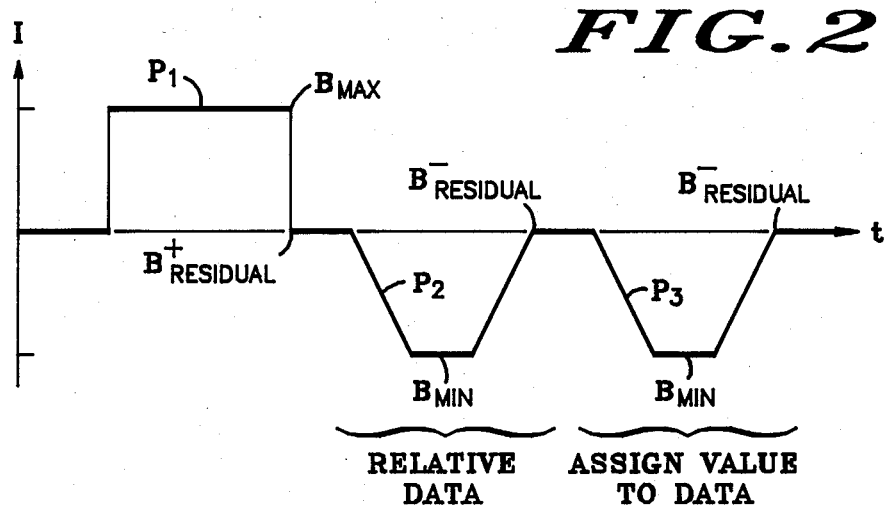
FIG. 2 is a graph of a current, I, being utilized by the device of FIG. 1.

Next, computer 11 causes negative current source 13 to provide a negative ramped increase in current to primary winding 18. This negative ramped current represents a strictly controlled and known change in current with respect to time. The change in current is represented in FIG. 2 by pulse $P_2$. This ramped increase of current can be varied by computer 11 to provide differing sets of hysteresis loops. The negative current, FIG. 2, causes the magnetic field density to move from $+B_{residual}$ to $B_{min}$ providing data illustrative of the line between these two points, FIG. 3.

When computer 11 activates negative current source 13 along line 21 it also activates A/D converter 16. A/D converter 16 is not activated when the positive pulse, $P_1$, is provided as this information is not required. Broken line 20, from computer 11 to A/D converter 16, is provided to illustrate that the functions of the negative and positive pulses may be interchanged and line 20 may be used in place of line 21.

The change in the magnetic flux density of toroid 14 causes a corresponding change in the voltage across secondary winding 19. One end of secondary winding 19 is coupled to ground and the other end is coupled to amplifier 15. Amplifier 15 is provided in the circuit to prevent the circuit from drawing current from secondary winding 19 and to condition the amplitude of the voltage to a level A/D converter 16 can utilize.

A/D converter 16, having been activated by computer 11 along line 21, converts the analog voltage signals received from amplifier 15 to digital signal. The digital signals are then stored in memory 17.

When the voltage across secondary winding 17 stabilizes it indicates that the point of negative saturation, $B_{min}$, has been reached on the hysteresis loop, FIG. 3. Pulse $P_2$ is then reduced in a controlled ramped manner back to zero, FIG. 2. As the current proceeds to zero, the magnetic flux density proceeds from $B_{min}$ to $-B_{residual}$. The voltage readings along this path are also measured and stored in memory 17.

Once pulse $P_2$ has been completed a set of data can be provided that shows a portion of the hysteresis loop from $+B_{residual}$ to $B_{min}$ to $-B_{residual}$. This data can be used to show the relative values of these points to each other, but not where these points reside on the H-B graph, FIG. 3.

Next, computer 11 causes a second controlled ramped negative pulse, $P_3$, to be transmitted to primary winding 18. This drives the magnetic flux density from $-B_{residual}$ to $B_{min}$, FIG. 3. Once $B_{min}$ has been reached a second time the current is again reduced to zero in a controlled ramped manner and the magnetic flux density returns to $-B_{residual}$.

The controlled currents provided to the primary winding from the current sources are provided here at a controlled ramped rate. This provides the system with a known fixed rate of increase over time, which is required to determine the magnetizing properties accurately. While the current here is shown to be ramped other types of current wave forms may be used as long as they are of a known, controlled nature, such as an exponential wave form.

The data from pulses $P_2$ and $P_3$ is then transmitted to computer 11 to be analyzed. The data from pulse $P_3$ is utilized to assign H-B coordinate values to the data obtained from pulse $P_2$.

The data, which computer 11 now contains, consists of the current, I, and voltage, V, that correspond to the magnetic flux densities of the hysteresis loop. Knowing V and I, the magnetic flux, B, values can be determined by the equation, $$B = (1/N) \int V dt \quad (1)$$

where:
N is the number of turns of the secondary winding;
V is the voltage measurement taken; and
t is the time.

The H, magnetic field, values of toroid 14 can be determined by the equation:

$$H = N(I/L) \quad (2)$$

where:
I is the current; and
L is the mean path length of toroid 14.

From these values one-half of the hysteresis loop, FIG. 3, can be determined. Since a hysteresis loop is usually symetrical about its center point the positive half of the loop can also be generated.

In addition to the hysteresis loop a number of other magnetic properties of the material can be determined. A sample of these and their equations are listed below:

(A) incremental permeability, $$\mu_{in} = (\Delta B / \Delta H) \quad (3)$$

(B) permeability, $$\mu = (B/H) \quad (4)$$

(C) reluctance, $$R = \int (dL / \mu A) \quad (5)$$

where:
A is the cross sectional area of toroid 14.

(D) Energy, $$w = AL \int H dB \quad (6)$$

(E) Hystersis Losses, $$R_h = H dB \quad (7)$$

(F) Coercive Forces $-H_c$ and $+H_c$, the value of H when B is zero; and (G) The residual magnetic fluxes, $-B_{residual}$ and $+B_{residual}$, the value of B when H is zero.

It should be noted here that the above list is submitted as a sample of the information to be determined from the hysteresis loop and that other magnetic properties may be determined from this information. Computer 11 can be set to derive information and provide any or all of the information listed above.

Thus, it is apparent that there has been provided, in accordance with the invention, a device and method that satisfies the objects, aims and advantages set forth above.

It has been shown that the present invention provides an apparatus and method of testing magnetic materials that provides an increased frequency response; is more versatile in its ability to test a variety of magnetic properties; and has a higher dynamic range.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A method of utilizing a testing device to test the magnetic properties of magnetic materials comprising the steps of:
   providing a current pulse of a first polarity to a primary winding coupled to said magnetic material;
   changing the magnetization of said magnetic material, resulting from said current pulse of said first polarity, driving said flux density of said magnetic material to a saturation level of said first polarity and then down to a residual level of said first polarity;
   providing a controlled current pulse of a second polarity to said primary winding;
   changing the magnetization of said magnetic material, resulting from said current pulse of said second polariy, driving a flux density from said residual level of said first polarity to a saturation level of said second polarity and then to a residual level of said second polarity;
   measuring changes in a voltage across a secondary winding coupled to said magnetic material during said current pulse of said second polarity;
   converting said measured voltages to digital signals;
   storing said digital signals in a storage device;
   providing a second controlled current pulse of said second polarity to said primary winding;
   changing the magnetization of the magnetic material, resulting from said current pulse of said second polarity, driving said flux density from said residual level of said second polarity to said saturation level of said second polarity and back to said residual level of said second polarity;
   measuring changes in the voltage across said secondary winding during said second current pulse of said second polarity;
   converting said measured voltages to digital signals;
   storing said digital signal in said storage device; and
   processing the data in said storage device to determine a magnetic property of said magnetic material.

2. The method of claim 1 wherein the step of providing a current pulse of said first polarity to a primary winding coupled to said magnetic material comprises the steps of:
   providing a computer controller;
   activating a current source of said first polarity upon receiving a signal from said computer controller; and
   providing said current pulse of said first polarity to said primary winding.

3. The method of claim 1 wherein said step of providing a controlled current pulse of said second polarity to said primary winding consists of the steps of:
   providing a computer controller;
   activating a current source of said second polarity by a signal from said computer controller;
   providing a controlled ramped current of said second polarity to said primary winding;
   measuring the voltage developed across said secondary winding; and
   reducing said current of said second polarity in a controlled ramped reduction once the voltage across said secondary winding has stabilized.

4. The method of claim 1 further comprising the step of transmitting said measured voltage through a high impedance amplifier prior to converting said measured voltage to said digital signal.

5. A method of utilizing a testing device to test the magnetic properties of a magnetic material comprising the steps of:
   coupling said magnetic material to a primary and secondary winding of said testing device;
   providing a current of a first polarity to said primary winding from a current source of said first polarity;
   driving a magnetic flux of said magnetic material to a saturation level of said first polarity resulting from said current of said first polarity;
   removing said current of said first polarity from said primary winding;
   allowing said magnetic flux of said magnetic material to move from said saturation level of said first polarity to a magnetic residual level of a second polarity;
   providing a controlled ramped current of a second polarity to said primary winding;
   driving said magnetic flux of said magnetic material to a saturation level of said second polarity resulting from said controlled ramped current of said second polarity;
   changing the voltage across said secondary winding, creating an analog voltage signal;
   transmitting said analog voltage signal to an analog to digital converter providing a plurality of digital voltage signals;
   storing said plurality of digital voltage signals in a memory;
   removing said current of said second polarity from said primary winding in a controlled ramped reduction;
   causing said magnetic flux of said magnetic material to move from said saturation level of said second polarity to a magnetic flux residual level of said second polarity resulting from said removal of said current of said second polarity;
   changing the voltage across said secondary winding, creating said analog voltage signal;
   transmitting said analog voltage signal to said analog digital converter providing said plurality of digital voltage signals;
   storing said plurality of digital voltage signals in said memory;
   providing a second controlled ramped current of said second polarity to said primary winding;
   driving said magnetic flux of said magnetic material to said saturation level of said second polarity resulting from said second controlled ramped current of said second polarity;
   changing the voltage across said secondary winding, creating a second analog voltage signal;

transmitting said second analog voltage signal to said analog digital converter providing a second plurality of digital voltage signals;

storing said second plurality of digital voltage signals in said memory;

removing said current of said second polarity from said primary winding in a controlled ramped reduction;

causing said magnetic flux of said magnetic material to move from said saturation level of said second polarity to said flux residual level of said second polarity resulting from said removal of said current of said second polarity; and processing said data from said memory to determine a magnetic property of said magnetic material.

6. An apparatus for testing magnetic properties of magnetic materials, said apparatus having an output, comprising:

control means for controlling a current means and an analog to digital converter, said control means having an input, an output, and first and second control lines, said output being coupled to said output of said testing apparatus;

current means controlled by said control means for providing a first current of a first polarity to initialize magnetization of said magnetic material and a second current of a second polarity for testing a magnetic property of said magnetic material, said current means having an output and first and second control lines, said first and second control lines being coupled to said first and second control lines of said control means, and said control means controlling a rate of rise and fall of said current;

a primary winding having a first end and a second end, said first end being coupled to said output of said current means, said second end being coupled to a ground and said primary winding being magnetically coupled to said magnetic material;

a secondary winding having a first end and a second end, said first end being coupled to said ground and said secondary winding being magnetically coupled to said magnetic material;

a high impedance amplifier having an input and an output, said input being coupled to said second end of said secondary winding;

an analog to digital converter controlled by said control means having an input, an output, and a control line, said input being coupled to said output of said high impedance amplifier and said control line being coupled to one of said first and second control lines of said control means, said analog to digital converter providing a digital signal representative of a magnetic property of said magnetic material; and a storage means for storing said digital signal from said analog to digital converter, said storage means having an input and an output, said input being coupled to said output of said analog to digital converter and said output being coupled to said input of said control means.

7. The apparatus of claim 6 wherein said control means consists of a computer.

8. The apparatus of claim 6 wherein said current means comprises:

a current source of said first polarity having a control line and an output, said control line being coupled to said first control line of said control means and said output being coupled to a first end of said primary winding; and a current source of said second polarity having a control line and an output, said control line being coupled to said second control line of said control means and said output being coupled to said first end of said primary winding.

9. The apparatus of claim 6 wherein said storage means comprises an integrated circuit memory device.

* * * * *